US008476910B2

(12) United States Patent  
Yeh et al.

(10) Patent No.: US 8,476,910 B2  
(45) Date of Patent: Jul. 2, 2013

(54) CAPACITIVE SENSOR HAVING CALIBRATION MECHANISM AND CAPACITIVE SENSING METHOD

(75) Inventors: Li-Ken Yeh, Hsinchu (TW); Siew-Seong Tan, Hsinchu (TW)

(73) Assignee: Memsor Corporation, Hsinchu (TW)

( * ) Notice: Subject to any disclaimer, the term of this patent is extended or adjusted under 35 U.S.C. 154(b) by 515 days.

(21) Appl. No.: 12/821,135

(22) Filed: Jun. 23, 2010

(65) Prior Publication Data

US 2011/0248723 A1  Oct. 13, 2011

(30) Foreign Application Priority Data

Apr. 9, 2010 (TW) .............................. 99111135 A

(51) Int. Cl.  
*G01R 35/00* (2006.01)  
*G01R 27/26* (2006.01)

(52) U.S. Cl.  
USPC ........................................................ 324/601

(58) Field of Classification Search  
USPC ............ 73/515, 718, 724; 324/457, 658–690, 324/601, 658–690; 341/143, 172; 348/E3.021, 348/E5.079, E5.091; 702/47, 52–54, 91, 702/195  
See application file for complete search history.

(56) References Cited

U.S. PATENT DOCUMENTS

2003/0011384 A1* 1/2003 Ishio et al. .................... 324/661  
2008/0218182 A1* 9/2008 Gao et al. ..................... 324/676

* cited by examiner

*Primary Examiner* — Melissa Koval  
*Assistant Examiner* — Brent J Andrews  
(74) *Attorney, Agent, or Firm* — CKC & Partners Co., Ltd.

(57) ABSTRACT

A capacitive sensor with a calibration mechanism is provided. The capacitive sensor includes a set of sensing capacitors to generate a capacitance variation, a subtraction circuit and an integration circuit. The subtraction circuit includes a first capacitor array to generate offset-adjusting charges and a second capacitor array to generate subtraction charges according to an initial offset and a sensitivity of the sensing capacitors respectively. The integration circuit includes two input ends, wherein one of them is connected to the sensing capacitors and the subtraction circuit. During a sensing period, the integration circuit performs integration according to the capacitance variation and performs cancellation of the effect of the initial offset according to the offset-adjusting charges to generate an integration output signal that is continuously subtracted by the subtraction charges during a computing period to generate a subtraction count. A capacitive sensing method is disclosed herein as well.

17 Claims, 7 Drawing Sheets

US 8,476,910 B2

CAPACITIVE SENSOR HAVING CALIBRATION MECHANISM AND CAPACITIVE SENSING METHOD

RELATED APPLICATIONS

This application claims priority to Taiwan Application Serial Number 99111135, filed Apr. 9, 2010, which is herein incorporated by reference.

BACKGROUND

1. Technical Field

The present disclosure relates to an electronic apparatus and method. More particularly, the present disclosure relates to a capacitive sensor and a capacitive sensing method with a calibration mechanism.

2. Description of Related Art

Various factors can change the structure of a capacitor, and the resulting change in capacitance can be used to sense those factors. Therefore, capacitors can be used as the sensor in condenser microphones, where one plate is moved by air pressure, relative to the fixed position of the other plate. Some accelerometers or gyroscopes use MEMS capacitors etched on a chip to measure the magnitude and direction of the acceleration vector as well. The MEMS capacitors are used to detect changes in acceleration, e.g. as tilt sensors or to detect free fall. Consequently, the changes in the acceleration, the angular acceleration and the volume can be detected by the variation of the charge stored in the capacitors that are designed carefully.

However, some non-ideal effects exist even if the capacitors are designed carefully. For instance, an ideal capacitor generates no capacitance variation when no stimulus is applied to the capacitor. However, if the capacitor is not symmetrical, an initial offset may produce an undesired capacitance variation even no stimulus is applied to the capacitor. On the other hand, two similar capacitors receiving the same stimulus may generate different amount of capacitance variation due to the slightly different sensitivity determined by the process variables of the two similar capacitors. However, in applications demanding a high level of precision, the non-ideal effects described above may result in a sensing result with a large amount of error.

Accordingly, what is needed is a capacitive sensor and a capacitive sensing method with a calibration mechanism. The present disclosure addresses such a need.

SUMMARY

An aspect of the present disclosure is to provide a capacitive sensor with a calibration mechanism. The capacitive sensor comprises a set of sensing capacitors, a subtraction circuit and an integration circuit. The sensing capacitors generate a capacitance variation. The subtraction circuit comprises a first capacitor array and a second capacitor array. The first capacitor array generates offset-adjusting charges according to an initial offset of the sensing capacitors. The second capacitor array generates subtraction charges according to a sensitivity of the sensing capacitors. The integration circuit comprises two input ends, wherein one of them is connected to the sensing capacitors and the subtraction circuit. When during a sensing period, the integration circuit performs integration according to the capacitance variation and performs a cancellation of the effect of the initial offset according to the offset-adjusting charges to generate an integration output signal. When during a computing period, the integration output signal is continuously subtracted by the subtraction charges to generate a subtraction count.

Another aspect of the present disclosure is to provide a capacitive sensing method with a calibration mechanism. The capacitive sensing method comprises the steps as follows. A capacitance variation is generated according to an amount of an external physical quantity change. A sensing period is entered to perform integration according to the capacitance variation. Offset-adjusting charges are generated according to an initial offset of the sensing capacitors to perform a cancellation of the effect of the initial offset. Whether the sensing period is finished is determined. An integration output signal is generated according to the result of the integration and the cancellation when the sensing period is finished. Subtraction charges are generated according to a sensitivity of the sensing capacitors. A computing period is entered to generate a subtraction count by continuously subtracting the integration output signal with the subtraction charges.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
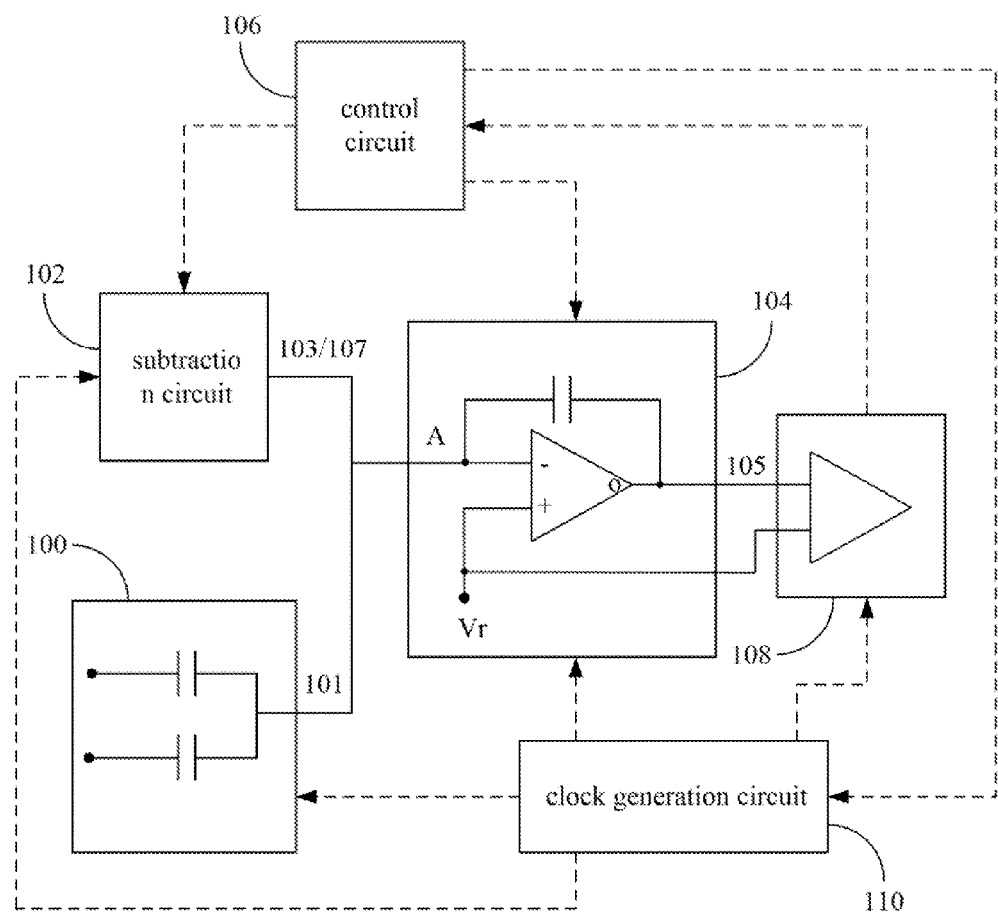
FIG. 1 is diagram of the capacitive sensor of an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1. FIG. 1 is diagram of the capacitive sensor 1 of an embodiment of the present disclosure. The capacitive sensor comprises a set of sensing capacitors 100, a subtraction circuit 102, an integration circuit 104, a control circuit 106, a comparator 108 and a clock generation circuit 110.

The sensing capacitors 100 generate a capacitance variation according to an amount of an external physical change and further produce a capacitance variation signal 101. For example, the sensing capacitors 100 are able to detect changes in acceleration, angular acceleration or volume to produce a capacitance variation. In the present embodiment, the sensing capacitors 100 comprise two capacitors each having two metal plates. The integration circuit 104 comprises two input ends and an output end. Substantially, the two input ends comprise a positive end and a negative end. The positive end is labeled as '+', the negative end is labeled as '−' and the output end is labeled as "o" in FIG. 1. In the present embodiment, the negative end is connected to the sensing capacitors 100 and the subtraction circuit 102 at point A, whereas the positive end receives a reference voltage Vr.

If the sensing capacitors 100 are ideal, there will not be any capacitance variation generated when no stimulus is applied to the capacitor. The ideal sensing capacitors 100 produce the capacitance variation signal 101 according to the capacitance variation only when an external physical quantity change is detected. Upon receiving the capacitance variation signal 101, the integration circuit 104 performs integration according to the capacitance variation signal 101. The integration result generated at the output end of the integration circuit 104 may be a positive value or a negative value relative to the reference voltage Vr, depending on the characteristic of the sensing capacitors 100.

However, some non-ideal effects exist even if the capacitors are designed carefully. If a capacitor is not symmetrical, an initial offset may cause an undesired capacitance variation even though no stimulus is applied to the capacitor. On the other hand, two similar capacitors receiving the same stimulus may generate different amount of capacitance variation due to the slightly different sensitivity determined by the process variables of the two similar capacitors.

The initial offset caused by the effect of the asymmetry of the sensing capacitors 100 described above makes the integration circuit 104 perform integration even no stimulus is applied to the sensing capacitors 100. Consequently, the non-ideal effect causes an inaccurate integration result when the actual detection mechanism is performed.

Figure 2A:
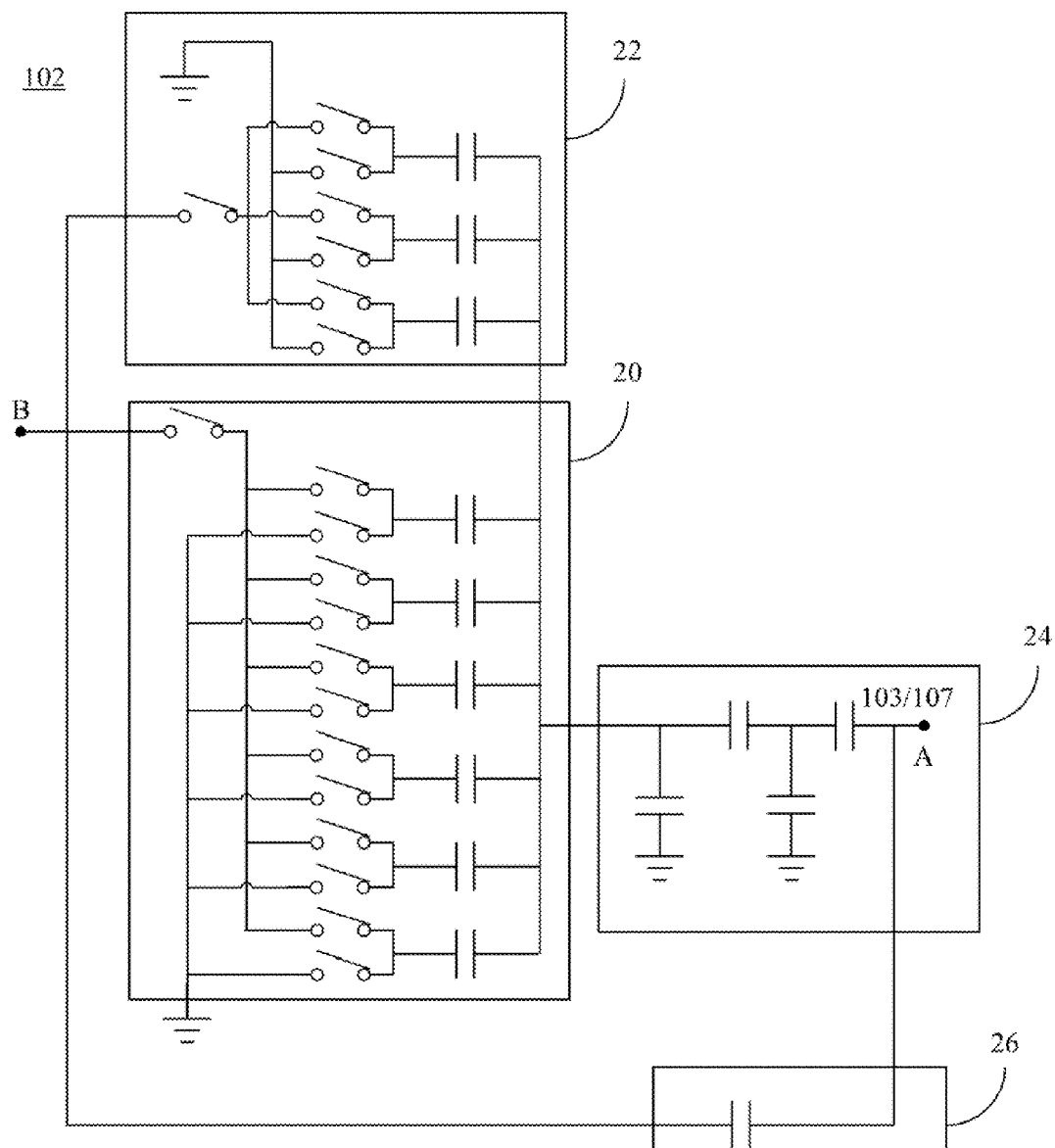
FIG. 2A is a more detailed circuit diagram of the subtraction circuit of an embodiment of the present disclosure.
Figure 2B:
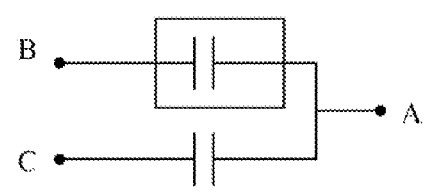
FIG. 2B is a diagram of the equivalent circuit of two subtraction circuits depicted in FIG. 2A.

Please refer to FIG. 2A. FIG. 2A is a more detailed circuit diagram of the subtraction circuit 102 of an embodiment of the present disclosure. The subtraction circuit 102 comprises a first capacitor array 20, a second capacitor array 22, a third capacitor array 24 and a reference capacitor 26. The first capacitor array 20 substantially comprises a plurality capacitors each having a switch. Different combinations of the switches can determine the quantity of the total capacitance of the first capacitor array 20 interposed between point A and point B. Accordingly, the operation mode of the switches can be determined according to the amount of the initial offset so that the first capacitor array 20 is able to generate an appropriate amount of offset-adjusting charges 103 according to the total capacitance that is determined according to the amount of the initial offset by the switches. The offset-adjusting charges 103 are sent from the point A to the negative end of the integration circuit 104. The subtraction circuit 102 is able to perform a positive subtraction or a negative subtraction according to the offset-adjusting charges 103. In an embodiment, two similar subtraction circuits 102 can be disposed such that one of the subtraction circuits 102 performs the positive subtraction and the other performs the negative subtraction. The equivalent circuit of the two subtraction circuits 102 is depicted in FIG. 2B, wherein the equivalent capacitor interposed between point A and point B comprises the capacitor array as depicted in FIG. 2A. The equivalent capacitor interposed between point A and point C comprises the capacitor array as depicted in FIG. 2A as well. However, these two equivalent capacitors provide subtrahends with opposite signs to perform the subtraction.

Please refer to FIG. 1 again. When the sensing capacitors 100 generate the capacitance variation signal 101, a sensing period is entered. The integration circuit 104 performs the integration according to the capacitance variation signal 101 and performs a cancellation of the effect of the initial offset according to the offset-adjusting charges 103 from the subtraction circuit 102 through the point A. In an embodiment, the offset-adjusting charges 103 are generated every fixed time interval to perform the cancellation. In other words, the offset-adjusting charges 103 provide a calibration mechanism to cancel the undesired integration result generated by the integration circuit 104 according to the undesired capacitance variation in the same time interval when no stimulus is applied to the sensing capacitors 100.

Figure 3A:
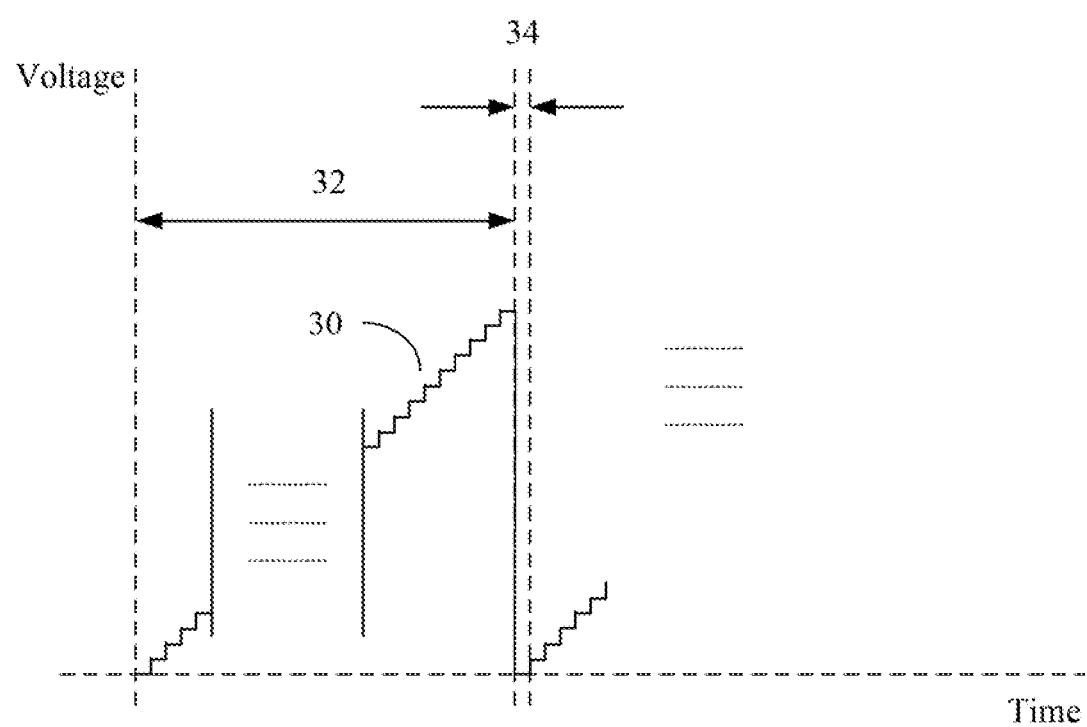
FIG. 3A is a diagram of the integration result generated by the integration circuit when no stimulus is applied to the non-ideal sensing capacitors of an embodiment of the present disclosure.

Please refer to FIG. 3A. FIG. 3A is a diagram of the integration result generated by the integration circuit 104 when no stimulus is applied to the non-ideal sensing capacitors 100 of an embodiment of the present disclosure.

The integration result is generated according to the initial offset of the non-ideal sensing capacitors 100. The integration result is a step-like waveform 30 as depicted in FIG. 3A. Therefore, the offset-adjusting charges 103 are generated at the end of every fixed time interval 32 to cancel the undesired integration result within the fixed time interval 32 in an embodiment. As depicted in FIG. 3A, an offset cancellation period 34 is shown right after the fixed time interval 32 to cancel the undesired integration result. Consequently, the cancellation mechanism can be applied to the integration circuit 104 of the capacitive sensor 1 to eliminate the effect of the initial offset.

For example, the integration circuit 104 performs integration in 1024 clocks according to the capacitance variation signal 101, whereas the offset-adjusting charges 103 are generated every 32 clocks to eliminate the effect of the initial offset. Thus, the offset-adjusting charges 103 are generated 32 times to cancel the effect of the initial offset within the 1024 clocks.

Please refer to FIG. 1 again. In an embodiment, the clock generation circuit 110 generates the reference clocks mentioned above to each component in the capacitive sensor 1. The control circuit 106 computes the number of the clocks when the sensing period initiates. When the number of clocks reaches a specific cycle count, the control circuit 106 determines that the sensing period is finished and makes the integration circuit 104 enters a computing period. An integration output signal 105 is generated at the output end according to the integration result and the cancellation of the effect of the initial offset.

Please refer to FIG. 2 again. During the computing period, the second capacitor array 22 substantially comprises a plurality of capacitors each having a switch, which is similar to the first capacitor array 20. Thus, the total capacitance of the second capacitor array 22 interposed between point A and point B is determined according to the different combinations of the switches. An appropriate amount of subtraction charges 107 are produced and are sent to the negative end of the integration circuit 104 through the point A.

Accordingly, please refer to FIG. 1 again. During the computing period, the integration circuit 104 performs the subtraction to continuously subtract the integration output signal 105 according to the subtraction charges 107 to generate a subtraction count. The comparator 108 receives the subtracted integration output signal 105 and further compare the subtracted integration output signal 105 with the reference voltage Vr. In an embodiment, when the integration output signal 105 has been subtracted to a value smaller then the reference voltage Vr, the comparator 108 determines that the computing period finished and generate the final subtraction count.

Figure 3B:
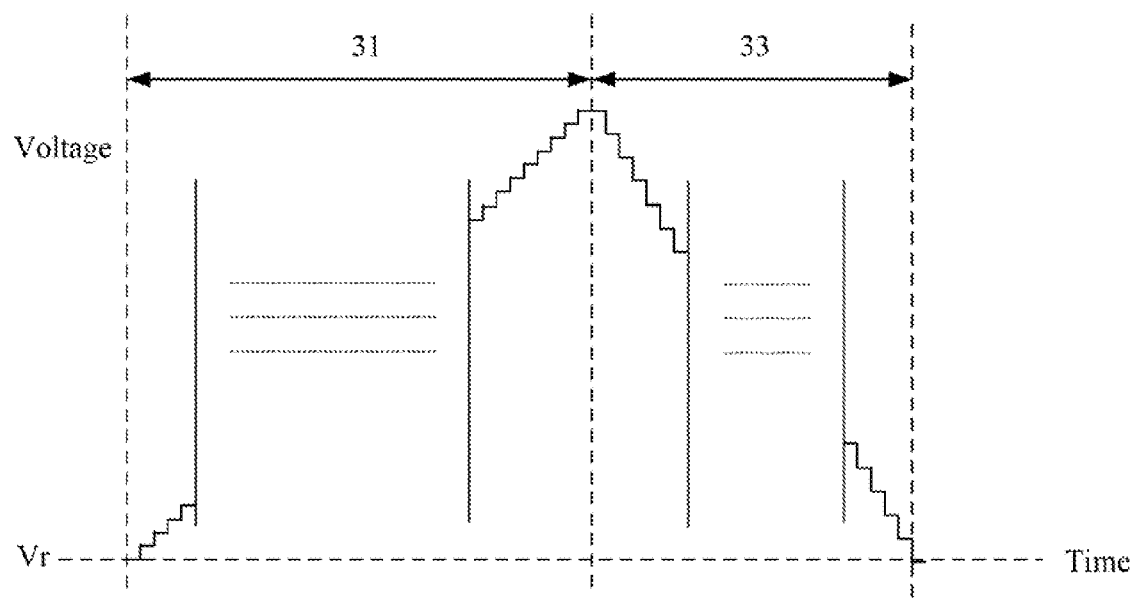
FIG. 3B is a diagram depicting the integration process within the sensing period and the subtraction process within the computing period.

Please refer to FIG. 3B. FIG. 3B is a diagram depicting the integration process within the sensing period 31 and the subtraction process within the computing period 33.

The integration output signal 105 is generated by the integration circuit 104 after the integration process of the sensing period 31 and is subtracted by the subtraction charges 107 in the computing period 33.

For example, in each clock of the computing period 33, the integration output signal 105 generated by the integration during the 1024 clocks of the sensing period 31 is subtracted by a fixed value determined by the subtraction charges 107 until the integration output signal 105 is smaller then the reference voltage Vr, i.e. the end of the computing period 33. The number of the times the subtraction performed in the computing period 33 is the subtraction count. It's noticed that the value of the reference voltage Vr can be different in different embodiments.

As described previously, two similar capacitors receiving the same stimulus may generate a different capacitance variation due to the slightly different sensitivity determined by the process variables of the two similar capacitors. The subtraction charges 107 can be tuned to an appropriate value by the second capacitor array 22 to eliminate the offset caused by the sensitivity of the capacitors.

The subtraction count represents the amount of the external physical quantity change, such as changes of the acceleration, the angular acceleration and the volume sensed by the sensing capacitors 200 of the capacitive sensor 1. In an embodiment, the control circuit 106 can further convert the subtraction count into a digital number and export the digital number to an external circuit (not shown).

In an embodiment, the switches of the first and the second capacitor array 20, 22 are controlled by the control circuit 106 according to the experiment result obtained by the experiments performed on the sensing capacitors 100 to quantize the effect of the initial offset and the offset caused by the sensitivity. Thus, the switches controlled by the control circuit 106 can make the first and the second capacitor array 20, 22 generate the offset-adjusting charges 103 and the subtraction charges 107 with appropriate values. The number of the capacitors in the first and the second capacitor array 20, 22 is not limited by the embodiment depicted in FIG. 2 and can be adjusted in order to obtain a more accurate calibration result. In an embodiment, the third capacitor array 24 is not necessary, and the calibration can be accomplished by the first and the second capacitor array 20, 22 only.

Accordingly, the initial offset and the offset caused by the sensitivity of the sensing capacitors 100 of the capacitive sensor 1 can be greatly reduced by the subtraction circuit 102. The accuracy of the capacitive sensor 1 is guaranteed.

Figure 4:
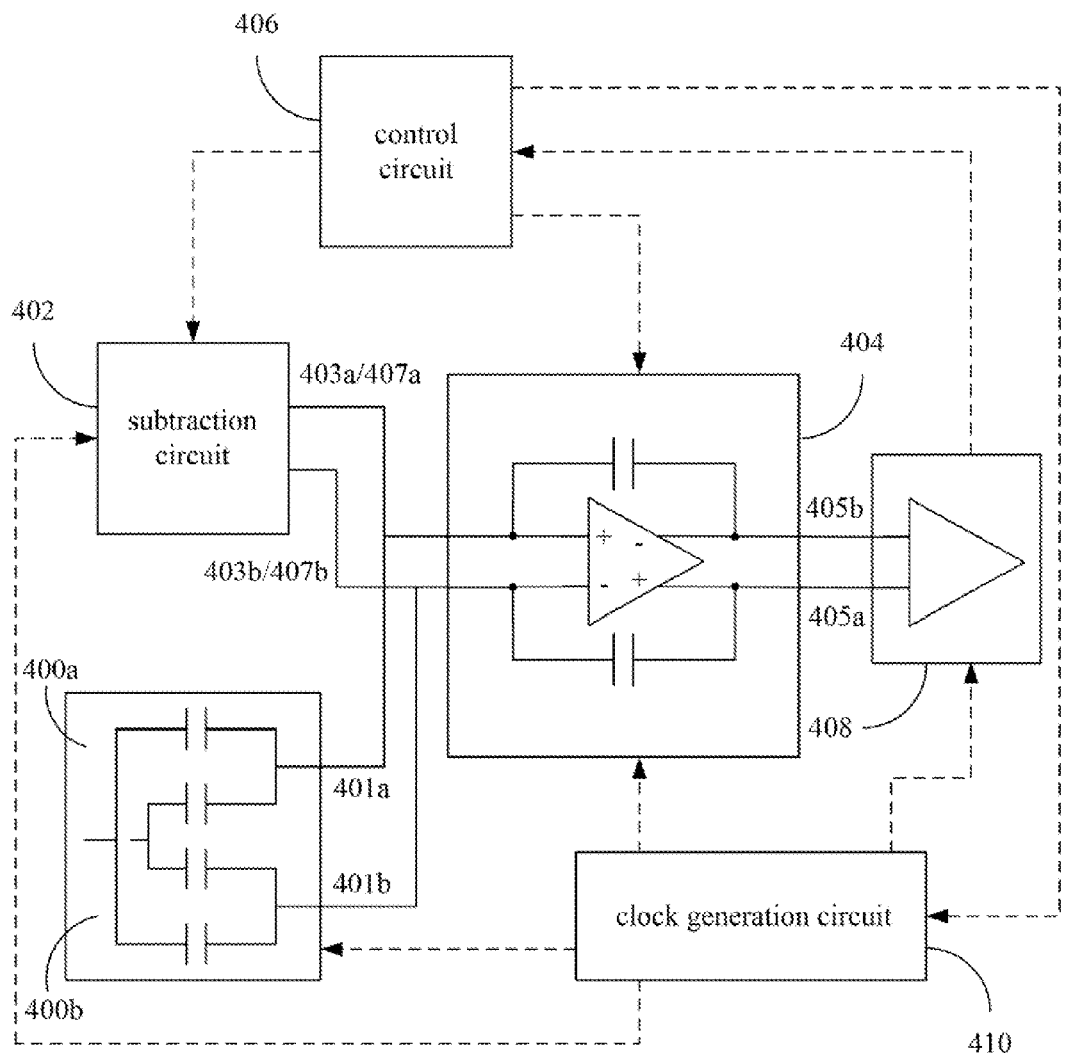
FIG. 4 is a circuit diagram of a capacitive sensor of another embodiment of the present disclosure.

Please refer to FIG. 4. FIG. 4 is a circuit diagram of a capacitive sensor 4 of an embodiment of the present disclosure. The capacitive sensor 4 comprises a group of first sensing capacitors 400a, a group of second sensing capacitors 400b, a subtraction circuit 402, an integration circuit 404, a control circuit 406, a comparator 408 and a clock generation circuit 410.

The first sensing capacitors 400a and the second sensing capacitors 400b are substantially symmetrical. Upon detecting an external physical quantity change, the first sensing capacitors 400a and the second sensing capacitors 400b generate a first capacitance variation and a second capacitance variation and further produce a first capacitance variation signal 401a and a second capacitance variation signal 401b respectively. The first capacitance variation signal 401a and the second capacitance variation signal 401b are opposite to each other. In the present embodiment, the first sensing capacitors 400a and the second sensing capacitors 400b are connected to the positive end and the negative end (labeled as '+' and '−' as in FIG. 1) of the integration circuit 404 respectively. Consequently, the integration circuit 404 receives the full differential signal comprising the first capacitance variation signal 401a and the second capacitance variation signal 401b to generate two integration results with the same absolute value, but one of them is positive and the other is negative.

The subtraction circuit 402 is similar to the subtraction circuit 102. Thus, no further detailed description is made here. However, the subtraction circuit 402 generates two offset-adjusting charges 403a, 403b and two subtraction charges 407a, 407b that are sent to the positive end and the negative end. As described previously, the two offset-adjusting charges 403a, 403b perform the elimination of the effect of the initial offset during the sensing period, and the two subtraction charges 407a, 407b keep subtracting the positive integration output signal 405a and the negative integration output signal 405b of opposite sign respectively to perform the elimination of the effect of the offset caused by the sensitivity during the computing period. It's noticed that the terms positive integration output signal 405a and the negative integration output signal 405b indicate that the positive integration output signal 405a is generated from the positive output end of the integration circuit 404 and the negative integration output signal 405b is generated from the negative output end of the integration circuit 404 and do not indicate the sign of the value of the integration output signal.

In the present embodiment, the comparator 408 receives the positive integration output signal 405a and the negative integration output signal 405b to make comparison. In an embodiment, the positive integration output signal 405a and the negative integration output signal 405b are subtracted by the subtraction charges 407a, 407b until their values approach or equal to 0 such that the comparator 408 determine the computing period is finished to generate the subtraction count. In other embodiment, other determination mechanism can be used to determine whether the computing period is finished.

Figure 5:
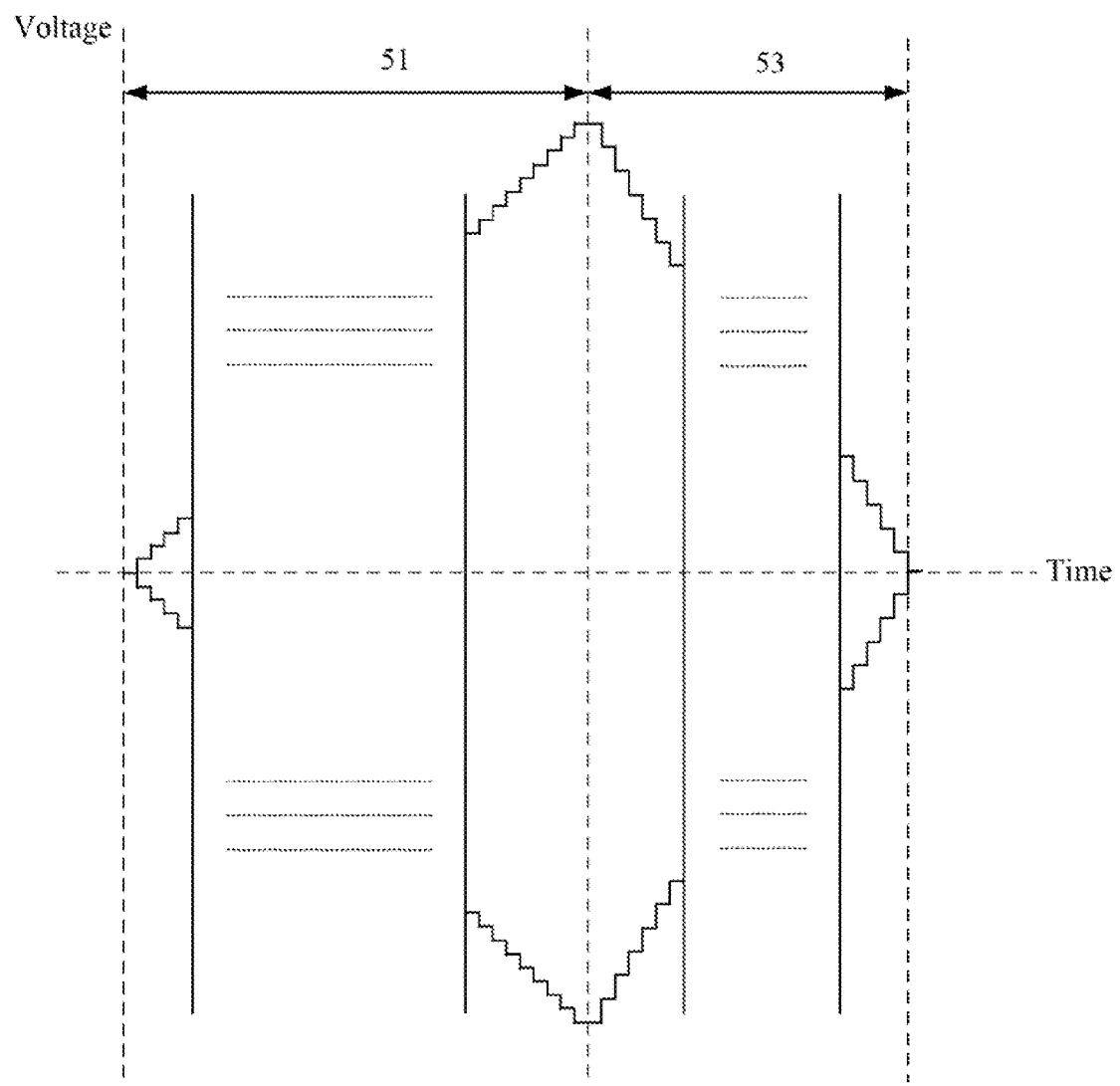
FIG. 5 is a diagram depicting the integration process within the sensing period and the subtraction process within the computing period.

Please refer to FIG. 5. FIG. 5 is a diagram depicting the integration process within the sensing period 51 and the subtraction process within the computing period 53.

The positive integration output signal 405a and the negative integration output signal 405b is generated by the integration circuit 404 after the integration process of the sensing period 51 and is subtracted by the subtraction charges 407a and 407b respectively in the computing period 53.

Similar to the previous embodiment, the control circuit 406 is able to control the duration of the sensing period and control the operation mode of the switches of the subtraction circuit 402 to adjust the accuracy of the calibration. Further, the control circuit 406 can further convert the subtraction count into a digital number and export the digital number to an external circuit (not shown).

Figure 6:
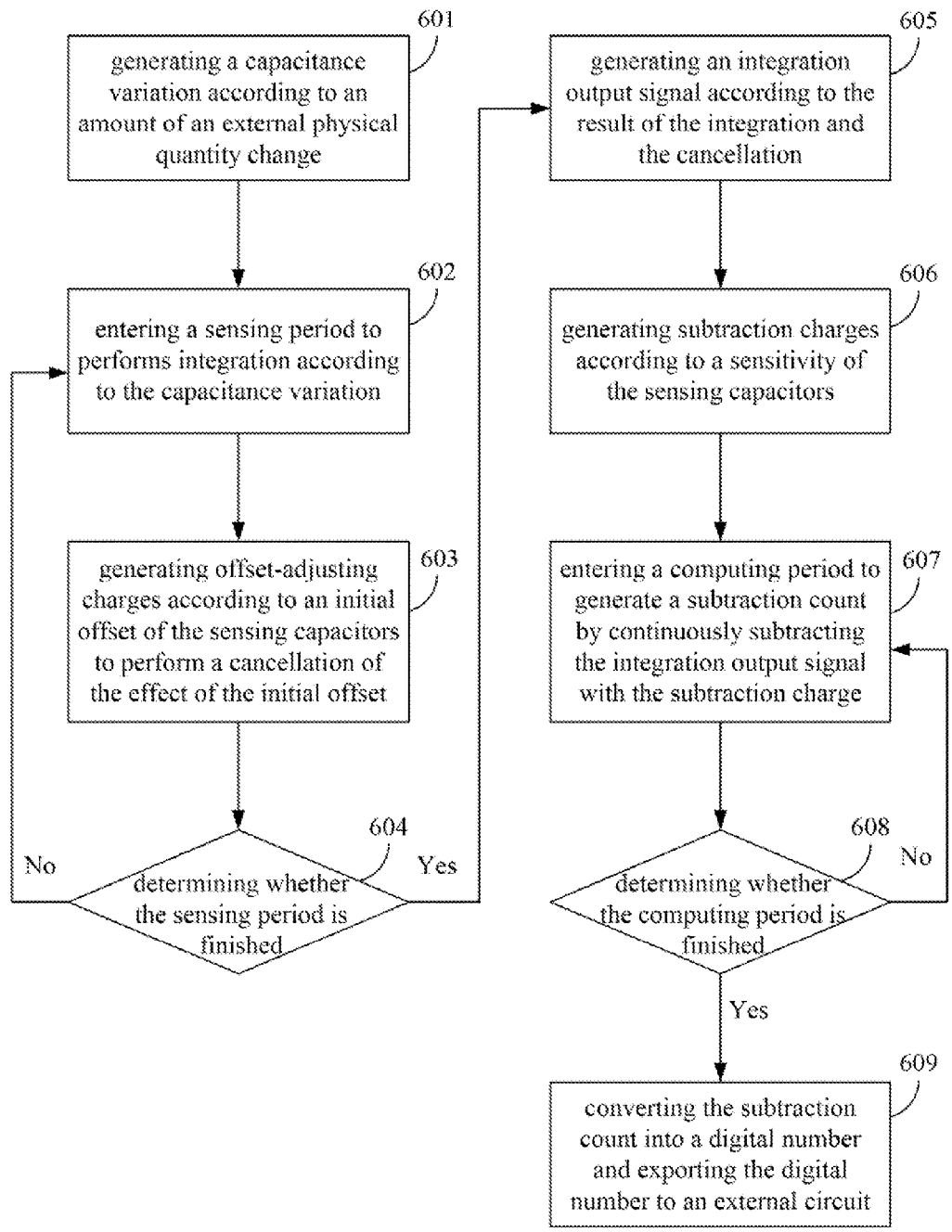
FIG. 6 is a flow chart of a capacitive sensing method with a calibration mechanism of an embodiment of the present disclosure.

Please refer to FIG. 6. FIG. 6 is a flow chart of a capacitive sensing method with a calibration mechanism of an embodiment of the present disclosure. The capacitive sensing method can be adapted to the capacitive sensor in FIG. 1 or FIG. 4. The following description is made by taking the capacitive sensor 1 in FIG. 1 as example. The capacitive sensing method comprises the steps as follows. (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 601, a capacitance variation signal 101 is generated by the sensing capacitance 100 according to an amount of an external physical quantity change. In step 602, a sensing period is entered to make the integration circuit 104 perform integration according to the capacitance variation signal 101. Offset-adjusting charges 103 are generated according to an initial offset of the sensing capacitors 100 to perform a cancellation of the effect of the initial offset in step 603. Whether the sensing period is finished is determined in step 604. When the sensing period is not finished yet, the integration and the cancellation are performed again in step 603 until the sensing period is determined to be finished.

When the sensing period is finished, an integration output signal 105 is generated according to the result of the integration and the cancellation in step 605. Further, subtraction charges 107 are generated according to a sensitivity of the sensing capacitors 100 in step 606. In step 607, a computing period is entered to generate a subtraction count by continuously subtracting the integration output signal 105 with the subtraction charges 107. Whether the computing period is finished is determined in step 608. When the computing period is not finished yet, the subtraction is performed again in step 607 until the computing period is determined to be finished. When the computing period is finished, the subtraction count is converted into a digital number and the digital number is exported to an external circuit.

Accordingly, the initial offset and the offset caused by the sensitivity of the sensing capacitors of the capacitive sensor can be greatly reduced by the subtraction circuit. The accuracy of the capacitive sensor is guaranteed.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A capacitive sensor with a calibration mechanism comprising:
    a set of sensing capacitors to generate a capacitance variation;
    a subtraction circuit comprising:
    a first capacitor array to generate offset-adjusting charges according to an initial offset of the sensing capacitors; and
    a second capacitor array to generate subtraction charges according to a sensitivity of the sensing capacitors, in which the subtraction charges is a fixed value; and
    an integration circuit comprising two input ends, wherein one of the two input ends is connected to the sensing capacitors and the subtraction circuit;
    wherein when during a sensing period, the integration circuit performs integration according to the capacitance variation and performs a cancellation of the effect of the initial offset according to the offset-adjusting charges to generate an integration output signal;
    when during a computing period, the integration output signal is continuously subtracted by the subtraction charges of the fixed value until the integration output signal is smaller then a reference voltage to generate a subtraction count.

2. The capacitive sensor of claim 1, wherein the offset-adjusting charges are generated every fixed time interval to perform the cancellation.

3. The capacitive sensor of claim 1, further comprising a control circuit to control the first and the second capacitor arrays to adjust the amount of the offset-adjusting charges and the subtraction charges.

4. The capacitive sensor of claim 3, wherein the control circuit further controls the duration of the sensing period.

5. The capacitive sensor of claim 3, wherein the control circuit further converts the subtraction count into a digital number and exports the digital number to an external circuit.

6. The capacitive sensor of claim 1, wherein the other one of the two input ends of the integration circuit is connected to a reference voltage.

7. The capacitive sensor of claim 1, further comprising a comparator to receive the integration output signal during the computing period to determine whether the computing period is finished.

8. The capacitive sensor of claim 1, wherein the sensing capacitors are a group of first sensing capacitors and the capacitance variation is a first capacitance variation, the capacitive sensor further comprises a group of second sensing capacitors to generate a second capacitance variation opposite to the first capacitance variation, whereas one of the two input ends of the of the integration circuit is connected to the first sensing capacitors and the subtraction circuit and the other end is connected to the second sensing capacitors and the subtraction circuit.

9. The capacitive sensor of claim 8, wherein the integration output signal substantially comprises a positive integration output signal and a negative integration output signal that are opposite to each other.

10. The capacitive sensor of claim 9, further comprising a comparator to receive the positive integration output signal and the negative integration output signal during the computing period to determine whether the computing period is finished.

11. The capacitive sensor of claim 1, wherein the sensing period is finished when a specific cycle count is reached.

12. A capacitive sensing method with a calibration mechanism comprising the steps of:
    generating a capacitance variation according to an amount of an external physical quantity change;
    entering a sensing period to performs integration according to the capacitance variation;
    generating offset-adjusting charges according to an initial offset of the sensing capacitors to perform a cancellation of the effect of the initial offset;
    determining whether the sensing period is finished;
    generating an integration output signal according to the result of the integration and the cancellation when the sensing period is finished;
    generating subtraction charges according to a sensitivity of the sensing capacitors, in which the subtraction charges is a fixed value; and
    entering a computing period to generate a subtraction count by continuously subtracting the integration output signal with the subtraction charges of the fixed value until the integration output signal is smaller then a reference voltage.

13. The capacitive sensing method of claim 12, wherein the offset-adjusting charges are generated every fixed time interval to perform the cancellation.

14. The capacitive sensing method of claim 12, further comprising a step of:

determining whether the computing period is finished according to the continuously subtracted integration output signal.

15. The capacitive sensing method of claim 12, wherein the integration output signal substantially comprises a positive integration output signal and a negative integration output signal that are opposite to each other, the capacitive sensing method further comprises a step of:
determining whether the computing period is finished according to the positive integration output signal and the negative integration output signal.

16. The capacitive sensing method of claim 12, wherein the sensing period is finished when a specific cycle count is reached.

17. The capacitive sensing method of claim 12, further comprising a step of:
converting the subtraction count into a digital number and exporting the digital number to an external circuit.

* * * * *